United States Patent
Kang et al.

(10) Patent No.: US 10,109,369 B2
(45) Date of Patent: Oct. 23, 2018

(54) TEST DEVICE AND TEST SYSTEM HAVING THE SAME

(71) Applicant: SAMSUNG ELECTRONICS CO., LTD., Suwon-si, Gyeonggi-Do (KR)

(72) Inventors: Dae-Shik Kang, Hwaseong-si (KR); Hyun-Sil Lim, Jeollabuk-do (KR); Min-Suk Choi, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 112 days.

(21) Appl. No.: 15/240,000

(22) Filed: Aug. 18, 2016

(65) Prior Publication Data

US 2017/0108548 A1  Apr. 20, 2017

(30) Foreign Application Priority Data

Oct. 19, 2015 (KR) ........................ 10-2015-0145354

(51) Int. Cl.
  *G01R 31/02* (2006.01)
  *G11C 29/00* (2006.01)
  *G01R 31/319* (2006.01)

(52) U.S. Cl.
  CPC ........ *G11C 29/00* (2013.01); *G01R 31/31907* (2013.01); *G01R 31/31908* (2013.01)

(58) Field of Classification Search
  None
  See application file for complete search history.

(56) References Cited

U.S. PATENT DOCUMENTS

| 5,367,263 A | * | 11/1994 | Ueda ................. G01R 31/2884 324/537 |
| 5,386,189 A | * | 1/1995 | Nishimura ....... G01R 31/31926 324/73.1 |
| 5,525,912 A | * | 6/1996 | Momohara ........ G01R 1/06705 324/73.1 |
| 5,818,249 A | * | 10/1998 | Momohara ........ G01R 1/07342 324/756.03 |
| 5,909,453 A | | 6/1999 | Kelem et al. |

(Continued)

FOREIGN PATENT DOCUMENTS

JP   2004-191149 A   7/2004
JP   2012-058009 A   3/2012
(Continued)

*Primary Examiner* — Patrick Assouad
*Assistant Examiner* — Demetrius Pretlow
(74) *Attorney, Agent, or Firm* — Volentine, Whitt & Francos, PLLC

(57) ABSTRACT

A test device for testing a plurality of semiconductor devices, each of which includes a plurality of functional blocks and a plurality of test pads coupled to the functional blocks. The test device includes a test header including a plurality of test channels, a plurality of test sites on which the semiconductor devices are installed, and a test control device. The test control device allocates the test channels to at least some of the test pads of the semiconductor devices to test more than two of the semiconductor devices simultaneously. The number of the test sites is greater than a value generated by dividing the number of the test channels by the number of the test pads of each of the semiconductor devices.

19 Claims, 10 Drawing Sheets

(56) References Cited

U.S. PATENT DOCUMENTS

| | | | | |
|---|---|---|---|---|
| 6,055,655 | A * | 4/2000 | Momohara | G01R 31/31721 |
| | | | | 257/E21.645 |
| 6,055,661 | A * | 4/2000 | Luk | G01R 31/3193 |
| | | | | 714/736 |
| 6,198,273 | B1 * | 3/2001 | Onishi | G01R 31/01 |
| | | | | 324/750.01 |
| 6,400,173 | B1 * | 6/2002 | Shimizu | G01R 31/2884 |
| | | | | 324/754.07 |
| 6,750,527 | B1 * | 6/2004 | Momohara | G01R 31/31721 |
| | | | | 257/355 |
| 6,928,606 | B2 | 8/2005 | Savaria et al. | |
| 7,898,286 | B2 | 3/2011 | Arsovski et al. | |
| 8,327,201 | B1 * | 12/2012 | Lai | G01R 31/318513 |
| | | | | 324/762.03 |
| 9,562,946 | B2 * | 2/2017 | Whetsel | G01R 31/3177 |
| 2003/0056183 | A1 | 3/2003 | Kobayashi | |
| 2004/0119491 | A1 * | 6/2004 | Shin | G01R 31/318505 |
| | | | | 324/762.06 |
| 2004/0145380 | A1 * | 7/2004 | Babcock | G01R 31/31924 |
| | | | | 324/679 |
| 2009/0134901 | A1 | 5/2009 | Chen et al. | |

FOREIGN PATENT DOCUMENTS

| | | |
|---|---|---|
| JP | 2014-220460 A | 11/2014 |
| KR | 2004-0104970 A | 12/2004 |
| KR | 2008-0057099 A | 6/2008 |

* cited by examiner

FIG. 7

| TEST MODE | FUNCTION BLOCK | # OF PARA |
|---|---|---|
| ONE TIME TEST MODE | FB1+FB2 | 2 |
| SEPARATION TEST MODE | FB1 | 6 |
| | FB2 | 3 |

TEST DEVICE AND TEST SYSTEM HAVING THE SAME

CROSS-REFERENCE TO RELATED APPLICATION(S)

This application claims priority under 35 USC § 119 to Korean Patent Application No. 10-2015-0145354, filed on Oct. 19, 2015 in the Korean Intellectual Property Office (KIPO), the contents of which are herein incorporated by reference in their entirety.

BACKGROUND

1. Technical Field

Example embodiments relate to a test of a semiconductor device, and more particularly to a test device for a semiconductor device and a test system including the test device.

2. Description of the Related Art

A semiconductor test device is an automated device combining hardware and software for performing an electrical test of a semiconductor device.

Recently, a capacity of a semiconductor device, such as dynamic random access memories (DRAMs), increases rapidly. As a capacity of a semiconductor device increases, a time required to perform an electrical test on the semiconductor device also increases.

For this reason, a parallel test system for testing a plurality of semiconductor devices simultaneously has been developed. However, in the parallel test system, as the number of the plurality of semiconductor devices tested simultaneously increases, a time required to test the plurality of semiconductor devices also increases.

SUMMARY

Some example embodiments are directed to provide a test device that is able to increase the number of semiconductor devices tested simultaneously.

Some example embodiments are directed to provide a test system including the test device.

According to example embodiments, a test device for testing a plurality of semiconductor devices, each of which includes a plurality of functional blocks and a plurality of test pads coupled to the functional blocks, includes a test header including a plurality of test channels, a plurality of test sites on which the semiconductor devices are installed, and a test control device configured to allocate the test channels to at least some of the test pads of the semiconductor devices to test more than two of the semiconductor devices simultaneously. The number of test sites is greater than a value generated by dividing the number of test channels by the number of test pads of each of the semiconductor devices.

In exemplary embodiments, the test control device: (1) allocates, in a first test mode, a first test channel among the test channels to one of the test pads of a semiconductor device that is installed on a first test site among the test sites and (2) allocates, in a second test mode, the first test channel to one of the test pads of a semiconductor device that is installed on a second test site, which is different from the first test site, among the test sites.

In exemplary embodiments, the first test mode corresponds to a one-time test mode in which all of the functional blocks of some of the semiconductor devices are tested simultaneously and the second test mode corresponds to a separation test mode in which only some of the functional blocks of at least one of the semiconductor devices are tested simultaneously.

In exemplary embodiments, the second test site is adjacent to the first test site.

In exemplary embodiments, the number of semiconductor devices that are tested simultaneously corresponds to an integer part of a value generated by dividing the number of test channels by the number of test pads coupled to at least one of the functional blocks, which are tested simultaneously.

In exemplary embodiments, in a one-time test mode in which all of the functional blocks are tested simultaneously, the test control device connects the test channels to only some of the semiconductor devices installed on the test sites.

In exemplary embodiments, in the one-time test mode, the semiconductor devices that are simultaneously tested are evenly distributed among the test sites.

In exemplary embodiments, in the one-time test mode, the number of semiconductor devices that are tested simultaneously corresponds to an integer part of a value generated by dividing the number of test channels by the number of test pads coupled to the plurality of functional blocks.

In exemplary embodiments, in the one-time test mode, the test control device connects the test channels to all of the test pads of the some semiconductor devices and simultaneously tests all of the functional blocks of the some semiconductor devices.

In exemplary embodiments, in a separation test mode in which at least one test functional block among the functional blocks is tested, the test control device connects the test channels to test pads coupled to the at least one test functional block of at least one of the semiconductor devices.

In exemplary embodiments, in the separation test mode, the number of semiconductor devices that are tested simultaneously corresponds to an integer part of a value generated by dividing the number of test channels by the number of test pads coupled to the at least one test functional block.

In exemplary embodiments, the test header further includes: (1) a controller configured to provide a test sequence, which is received from the test control device, to the test channels, and to provide a test result signal, which is received from the test channels, to the test control device; (2) a path control circuit configured to control connections between the test channels and a plurality of output electrodes based on a control signal received from the test control device; and (3) a probe card including connectors coupled to the output electrodes and probe needles contacting the plurality of test pads of the semiconductor devices.

In exemplary embodiments, the test channels include: (1) a plurality of drive channels configured to test drive pads among the test pads of the semiconductor devices and (2) a plurality of input-output channels configured to test input-output pads among the test pads of the semiconductor devices.

According to example embodiments, a test system includes a test device and a plurality of semiconductor devices, each of the semiconductor devices including a plurality of functional blocks and a plurality of test pads coupled to the functional blocks. The test device includes a plurality of test channels and a plurality of test sites on which the semiconductor devices are installed, the test device allocating the test channels to at least some of the test pads of the semiconductor devices to test more than two of the semiconductor devices simultaneously. The number of test sites is greater than a value generated by dividing the number of test channels by the number of test pads of each of the semiconductor devices.

In exemplary embodiments, the test device: (1) allocates, in a first test mode, a first test channel among the test channels to one of the test pads of a semiconductor device that is installed on a first test site among the test sites and (2) allocates, in a second test mode, the first test channel to one of the test pads of a semiconductor device that is installed on a second test site, which is different from the first test site, among the test sites.

According to example embodiments, a test device tests a plurality of semiconductor devices, each of which includes a plurality of functional blocks. The test device includes a plurality of test channels and a test control device. The test control device: (1) for a first mode of operation, connects the test channels to all of the functional blocks of one or more of the semiconductor devices so as to simultaneously test all of the functional blocks of the one or more semiconductor devices and (2) for a second mode of operation, connects the test channels to fewer than all of the functional blocks of two or more of the semiconductor devices so as to simultaneously test the fewer than all functional blocks of the two or more semiconductor devices.

BRIEF DESCRIPTION OF THE DRAWINGS

Illustrative, non-limiting example embodiments will be more clearly understood from the following detailed description in conjunction with the accompanying drawings.

FIG. 7 is a diagram illustrating the number of semiconductor devices simultaneously tested by the test system of FIG. 1 according to an operation mode.

DETAILED DESCRIPTION OF THE EMBODIMENTS

Figure 1:
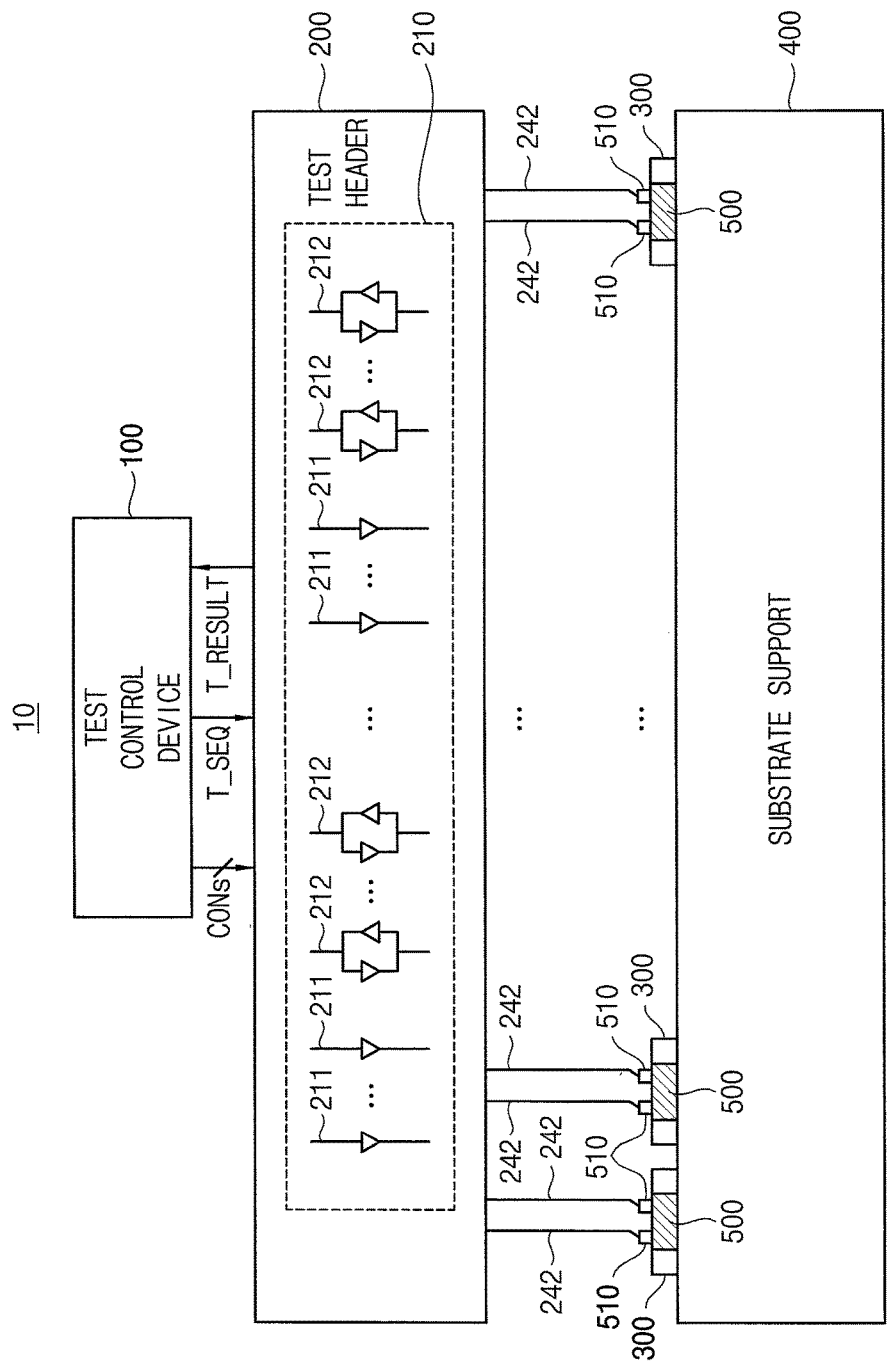
FIG. 1 is a block diagram illustrating a test system according to example embodiments.

Various example embodiments will be described more fully with reference to the accompanying drawings, in which some example embodiments are shown. The present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a test system according to example embodiments.

Referring to FIG. 1, a test system 10 includes a test device, which includes a test control device 100, a test header 200, a plurality of test sites 300, and a substrate support 400, and a plurality of semiconductor devices 500 tested by the test device.

The plurality of semiconductor devices 500 are installed on the plurality of test sites 300, respectively, to be tested by the test device.

Each of the plurality of semiconductor devices 500 may include a plurality of test pads 510. Each of the plurality of semiconductor devices 500 may be coupled to the test header 200 through the plurality of test pads 510 when the plurality of semiconductor devices 500 are installed on the plurality of test sites 300, respectively.

Each of the plurality of semiconductor devices 500 may receive a test signal from the test header 200 through the plurality of test pads 510, and provide a test result signal to the test header 200 through the plurality of test pads 510.

The test device may determine whether each of the plurality of semiconductor devices 500 operates correctly based on the test result signal received from each of the plurality of semiconductor devices 500.

In some example embodiments, each of the plurality of semiconductor devices 500 may include a power management integrated circuit (PMIC) controlling a power supply to other semiconductor devices.

In other example embodiments, each of the plurality of semiconductor devices 500 may include a semiconductor memory device such as a dynamic random access memory, a flash memory, etc.

However, example embodiments are not limited thereto. According to example embodiments, each of the plurality of semiconductor devices 500 may include any semiconductor devices.

The test control device 100 may correspond to an electronic device, such as a workstation, a personal computer, etc., that is able to execute a test program. The test control device 100 may provide a test sequence T_SEQ to the test header 200 using the test program. For example, the test sequence T_SEQ may include a series of test values for testing the plurality of semiconductor devices 500.

In addition, the test control device 100 may control an operation of the test header 200 using control signals CONs.

The test header 200 may be coupled to the plurality of test pads 510 included in the plurality of semiconductor devices 500 installed on the plurality of test sites 300.

In some example embodiments, the test header 200 may contact the plurality of test pads 510 included in the plurality of semiconductor devices 500 installed on the plurality of test sites 300 through a plurality of probe needles 242.

The test header 200 may include a plurality of test channels 210. The test header 200 may connect each of the plurality of test channels 210 to one of the plurality of test pads 510 included in the plurality of semiconductor devices 500 based on the control signals CONs received from the test control device 100. Each of the plurality of test channels 210 may provide the test signal to a respective semiconductor device 500 through a respective test pad 510 coupled to each of the plurality of test channels 210 to test the respective semiconductor device 500.

In some example embodiments, the number of the plurality of test channels 210 included in the test header 200 may be smaller than a value generated by multiplying the number of the plurality of test pads 510 included in each of the plurality of semiconductor devices 500 with the number of the plurality of test sites 300. Therefore, the test header 200 may connect the plurality of test channels 210 to a part of the plurality of test pads 510 included in the plurality of semiconductor devices 500 installed on the plurality of test sites 300 based on the control signals CONs received from the test control device 100.

The test header 200 may provide the test signal to semiconductor devices 500, which are coupled to the plurality of test channels 210, among the plurality of semiconductor devices 500 through the plurality of test channels 210 based on the test sequence T_SEQ received from the test control device 100.

In addition, the test header 200 may receive the test result signal from the semiconductor devices 500, which are coupled to the plurality of test channels 210, through the plurality of test channels 210, and provide the test result signal to the test control device 100 as a test result data T_RESULT.

In some example embodiments, as illustrated in FIG. 1, the plurality of test channels 210 may include a plurality of drive channels 211 for testing drive pads among the plurality of test pads 510 included in the plurality of semiconductor devices 500, and a plurality of input-output channels 212 for testing input-output pads among the plurality of test pads 510 included in the plurality of semiconductor devices 500. The drive channel 211 may include an output driver, and an input-output channel 212 may include an output driver and an input driver.

Figure 2:
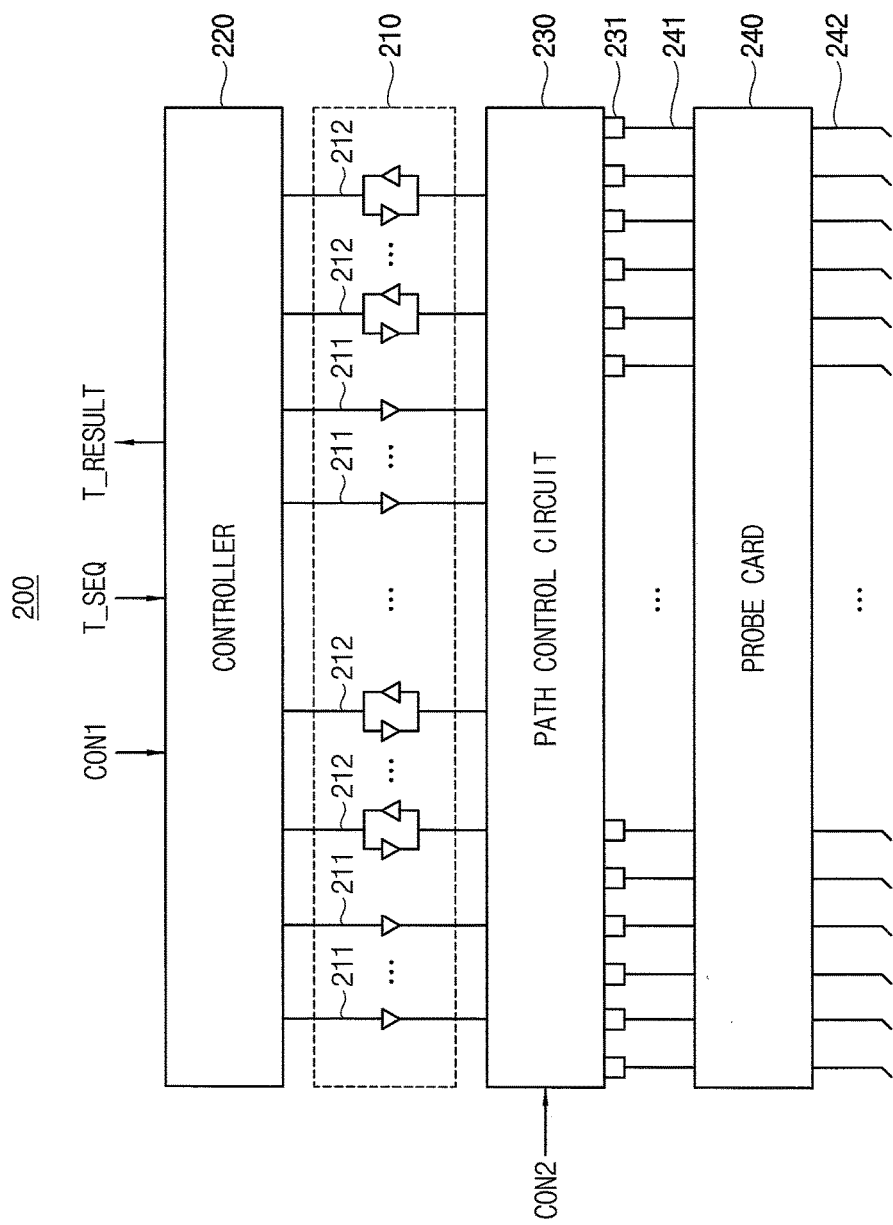
FIG. 2 is a block diagram illustrating an example of a test header included in the test system of FIG. 1.

FIG. 2 is a block diagram illustrating an example of a test header included in the test system of FIG. 1.

Referring to FIG. 2, the test header 200 may include the plurality of test channels 210, a controller 220, a path control circuit 230, and a probe card 240.

The controller 220 may receive a first control signal CON1 and the test sequence T_SEQ from the test control device 100. The controller 220 may provide the test values included in the test sequence T_SEQ to the plurality of test channels 210 based on the first control signal CON1.

In addition, the controller 220 may provide the test result signal received from the plurality of test channels 210 to the test control device 100 as the test result data T_RESULT.

The path control circuit 230 may include a plurality of output electrodes 231. The number of the plurality of output electrodes 231 included in the path control circuit 230 may be equal to the value generated by multiplying the number of the plurality of test pads 510 included in each of the plurality of semiconductor devices 500 with the number of the plurality of test sites 300. Therefore, the plurality of output electrodes 231 may be coupled to all of the plurality of test pads 510 included in the plurality of semiconductor devices 500 installed on the plurality of test sites 300.

The path control circuit 230 may receive a second control signal CON2 from the test control device 100. The path control circuit 230 may control connections between the plurality of test channels 210 and the plurality of output electrodes 231 based on the second control signal CON2. For example, since the number of the plurality of test channels 210 is smaller than the number of the plurality of output electrodes 231 included in the path control circuit 230, the path control circuit 230 may connect the plurality of test channels 210 to a part of the plurality of output electrodes 231.

The probe card 240 may include connectors 241 coupled to the plurality of output electrodes 231 and the probe needles 242 contacting the plurality of test pads 510 included in the plurality of semiconductor devices 500 installed on the plurality of test sites 300. In some example embodiments, the connectors 241 and the probe needles 242 may be internally coupled to each other in the probe card 240.

The probe card 240 may operate as an interface circuit connecting the test header 200 to the plurality of semiconductor devices 500. For example, the probe card 240 may transfer the test signal, which is received through the connectors 241, to the probe needles 242, and transfer the test result signal, which is received through the probe needles 242, to the connectors 241.

Therefore, the plurality of output electrodes 231 included in the path control circuit 230 may be coupled to the plurality of test pads 510 included in the plurality of semiconductor devices 500 installed on the plurality of test sites 300 through the probe card 240.

Referring again to FIG. 1, the plurality of test sites 300 may be disposed on the substrate support 400, and the plurality of semiconductor devices 500 may be installed on the plurality of test sites 300, respectively. Therefore, the number of the plurality of test sites 300 may correspond to a maximum number of semiconductor devices 500 that the test system 10 is able to test simultaneously.

In some example embodiments, the test header 200 may move up and down such that the plurality of semiconductor devices 500 may be easily installed on the plurality of test sites 300 on the substrate support 400. However, example embodiments are not limited thereto. According to example embodiments, the test header 200 may be fixed while the substrate support 400 moves up and down, or both the test header 200 and the substrate support 400 may move up and down.

Figure 3:
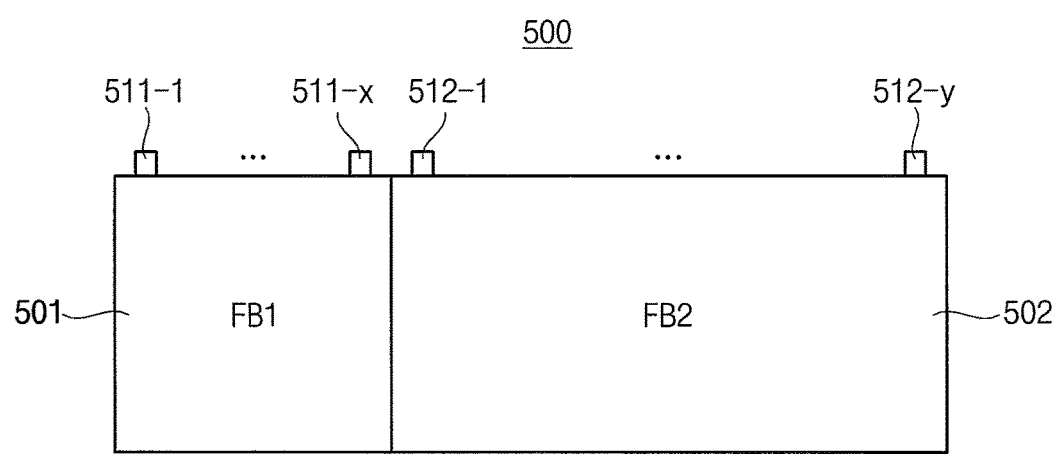
FIG. 3 is a block diagram illustrating an example of a semiconductor device included in the test system of FIG. 1.

FIG. 3 is a block diagram illustrating an example of a semiconductor device included in the test system of FIG. 1.

Each of the plurality of semiconductor devices 500 installed on the plurality of test sites 300 of FIG. 1 may be implemented with a semiconductor device 500 of FIG. 3.

Referring to FIG. 3, the semiconductor device 500 may include a plurality of functional blocks FB1 and FB2. For example, the semiconductor device 500 may include various kinds of functional blocks such as an image processing block, a sound output block, a memory block, etc.

In FIG. 3, the semiconductor device 500 is illustrated to include a first functional block FB1 501 and a second functional block FB2 502 as an example. However, example embodiments are not limited thereto. According to example embodiments, the semiconductor device 500 may include more than three functional blocks.

The semiconductor device 500 may include a plurality of first test pads 511-1~511-$x$ coupled to the first functional block FB1 and a plurality of second test pads 512-1~512-$y$ coupled to the second functional block FB2. Here, x and y represent positive integers.

Therefore, when the plurality of test channels 210 included in the test header 200 are coupled to all of the plurality of first test pads 511-1~511-$x$ and the plurality of second test pads 512-1~512-$y$, the test device may simultaneously test the first functional block FB1 and the second functional block FB2 included in the semiconductor device 500.

On the other hand, when the plurality of test channels 210 included in the test header 200 are coupled to only the plurality of first test pads 511-1~511-$x$, the test device may test only the first functional block FB1 included in the semiconductor device 500. Similarly, when the plurality of test channels 210 included in the test header 200 are coupled to only the plurality of second test pads 512-1~512-$y$, the test device may test only the second functional block FB2 included in the semiconductor device 500.

Referring again to FIG. 1, the number of the plurality of test sites 300 may be greater than a value generated by dividing the number of the plurality of test channels 210 by the number of the plurality of test pads 510 included in each of the plurality of semiconductor devices 500. Therefore, the test system 10 may either simultaneously test only a part of the plurality of semiconductor devices 500 installed on the plurality of test sites 300 or simultaneously test only a part of the plurality of functional blocks FB1 and FB2 included in the plurality of semiconductor devices 500 installed on the plurality of test sites 300.

The number of semiconductor devices that a test system is able to test simultaneously may be referred to as a Para number. As the number of semiconductor devices that a test system is able to test simultaneously (that is, the Para number) increases, time required to test a plurality of semiconductor devices with the test system may be decreased.

As will be described later, the test system 10 according to example embodiments may test the plurality of semiconductor devices 500 using as many test channels 210 as possible, which correspond to test resources of the test system 10, according to an operation mode. Therefore, the test system 10 may simultaneously test the semiconductor devices 500 of a maximum Para number according to the operation mode, such that a test speed of the test system 10 may be increased.

In some example embodiments, the test system 10 may operate in one of a one-time test mode and a separation test mode.

In the one-time test mode, the test system 10 may simultaneously test all of the plurality of functional blocks FB1 and FB2 included in only a part of the plurality of semiconductor devices 500 installed on the plurality of test sites 300.

In the separation test mode, the test system 10 may simultaneously test only a part of the plurality of functional blocks FB1 and FB2 included in at least one of the plurality of semiconductor devices 500 installed on the plurality of test sites 300.

Generally, in a development process of a semiconductor device, a test operation is performed on the semiconductor device in the one-time test mode to verify all of functional blocks included in the semiconductor device at one time.

On the other hand, in a manufacturing process of a semiconductor device after the semiconductor device is developed, a plurality of the semiconductor devices are required to be tested. Therefore, a test operation is performed on the plurality of semiconductor devices in the separation test mode to decrease a test time, such that functional blocks included in the semiconductor device are tested separately.

Figure 4:
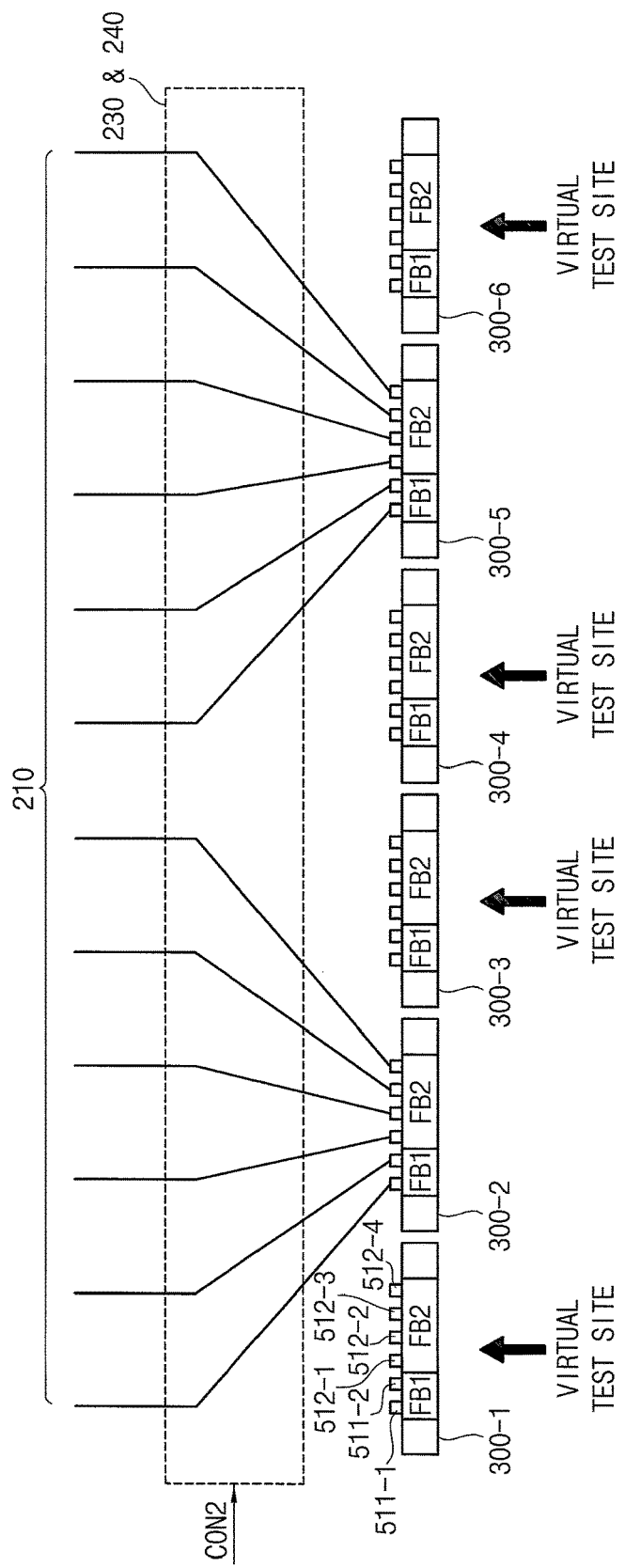
FIG. 4 is a diagram for describing an operation of the test system of FIG. 1 performed in a development process of a semiconductor device.

FIG. 4 is a diagram for describing an operation of the test system of FIG. 1 performed in a development process of a semiconductor device.

As described above, in a development process of a semiconductor device, the semiconductor device is tested in the one-time test mode such that all of functional blocks included in the semiconductor device are tested simultaneously. Therefore, FIG. 4 represents an operation of the test system 10 in the one-time test mode.

In FIG. 4, the test system 10 is illustrated to include twelve test channels 210 and six test sites 300-1~300-6 as an example. In addition, two of the first test pads 511-1 and 511-2 are coupled to the first functional block FB1 included in the semiconductor device 500, and four of the second test pads 512-1, 512-2, 512-3, and 512-4 are coupled to the second functional block FB2 included in the semiconductor device 500 in FIG. 4. However, example embodiments are not limited thereto. According to example embodiments, the test system 10 may include any number of test channels 210 and any number of test sites 300. In addition, any number of the first test pads 511-1~511-$x$ may be coupled to the first functional block FB1, and any number of the second test pads 512-1~512-$y$ may be coupled to the second functional block FB2.

In some example embodiments, in the one-time test mode, the test header 200 may connect the plurality of test channels 210 to the plurality of test pads 510, which are coupled to all of the plurality of functional blocks FB1 and FB2 included in only a part of the plurality of semiconductor devices 500 installed on the plurality of test sites 300, through the path control circuit 230 and the probe card 240 based on the second control signal CON2 received from the test control device 100.

For example, as illustrated in FIG. 4, six test channels 210 among the plurality of test channels 210 may be connected to the plurality of first test pads 511-1 and 511-2 and the plurality of second test pads 512-1, 512-2, 512-3, and 512-4, which are included in the semiconductor device 500 installed on the second test site 300-2 among the first through sixth test sites 300-1~300-6, and the rest of six test channels 210 among the plurality of test channels 210 may be connected to the plurality of first test pads 511-1 and 511-2 and the plurality of second test pads 512-1, 512-2, 512-3, and 512-4, which are included in the semiconductor device 500 installed on the fifth test site 300-5 among the first through sixth test sites 300-1~300-6.

After that, the test control device 100 may simultaneously test all of the plurality of functional blocks FB1 and FB2 included in the part of the plurality of semiconductor devices 500 to which the plurality of test channels 210 are coupled.

For example, as illustrated in FIG. 4, the test system 10 may simultaneously test all of the plurality of functional blocks FB1 and FB2 included in the semiconductor device 500 installed on the second test sites 300-2 and the semiconductor device 500 installed on the fifth test sites 300-5.

As described above with reference to FIG. 4, in the one-time test mode, the number of semiconductor devices 500, which are tested simultaneously, among the plurality of semiconductor devices 500 installed on the plurality of test sites 300 may correspond to an integer part of a value generated by dividing the number of the plurality of test channels 210 by the number of the plurality of test pads 510 coupled to the plurality of functional blocks FB1 and FB2. Therefore, in the one-time test mode, the test system 10 may simultaneously test a maximum number of semiconductor devices 500 that the test system 10 is able to test at one time using the plurality of test channels 210. For example, in the case of FIG. 4, the test system 10 may simultaneously test the semiconductor devices 500 of a maximum Para number, that is, two semiconductor devices 500 in the one-time test mode.

In some example embodiments, as illustrated in FIG. 4, in order to connect the probe needles 242 included in the test header 200 to the plurality of test pads 510 included in the semiconductor device 500 easily, the test sites 300-1, 300-3, 300-4, and 300-6 on which semiconductor devices 500 including no test pad 510 connected to the plurality of test channels 210 are installed may be evenly distributed among the test sites 300-2 and 300-5 on which semiconductor devices 500 including the plurality of test pads 510 connected to the plurality of test channels 210 are installed.

Since the plurality of test channels 210 are not connected to the plurality of test pads 510 included in the semiconductor devices 500 installed on the test sites 300-1, 300-3, 300-4, and 300-6, the test system 10 may not perform a test operation on the semiconductor devices 500 installed on the test sites 300-1, 300-3, 300-4, and 300-6. As illustrated in FIG. 4, each of the test sites 300-1, 300-3, 300-4, and 300-6 on which the semiconductor device 500 including no test pad 510 connected to the plurality of test channels 210 is installed may be referred to as a virtual test site.

Even if the test system 10 does not include the virtual test sites, the test system 10 may be able to simultaneously test the semiconductor devices 500 of a maximum Para number in the one-time test mode.

However, as will be described below with reference to FIGS. 5 and 6, if the test system 10 does not include the virtual test sites and includes only the test sites 300 of the maximum Para number of the one-time test mode (that is, two in the case of FIG. 4), the test system 10 may not use as many test channels 210 as possible, which correspond to test resources of the test system 10, due to the lack of the test sites 300 when the test system 10 operates in the separation test mode during a manufacturing process of the semiconductor device 500. In this case, the test system 10 may not simultaneously test the semiconductor devices 500 of a maximum Para number of the separation test mode but simultaneously test the semiconductor devices 500 of a number smaller than the maximum Para number of the separation test mode.

Figure 5:
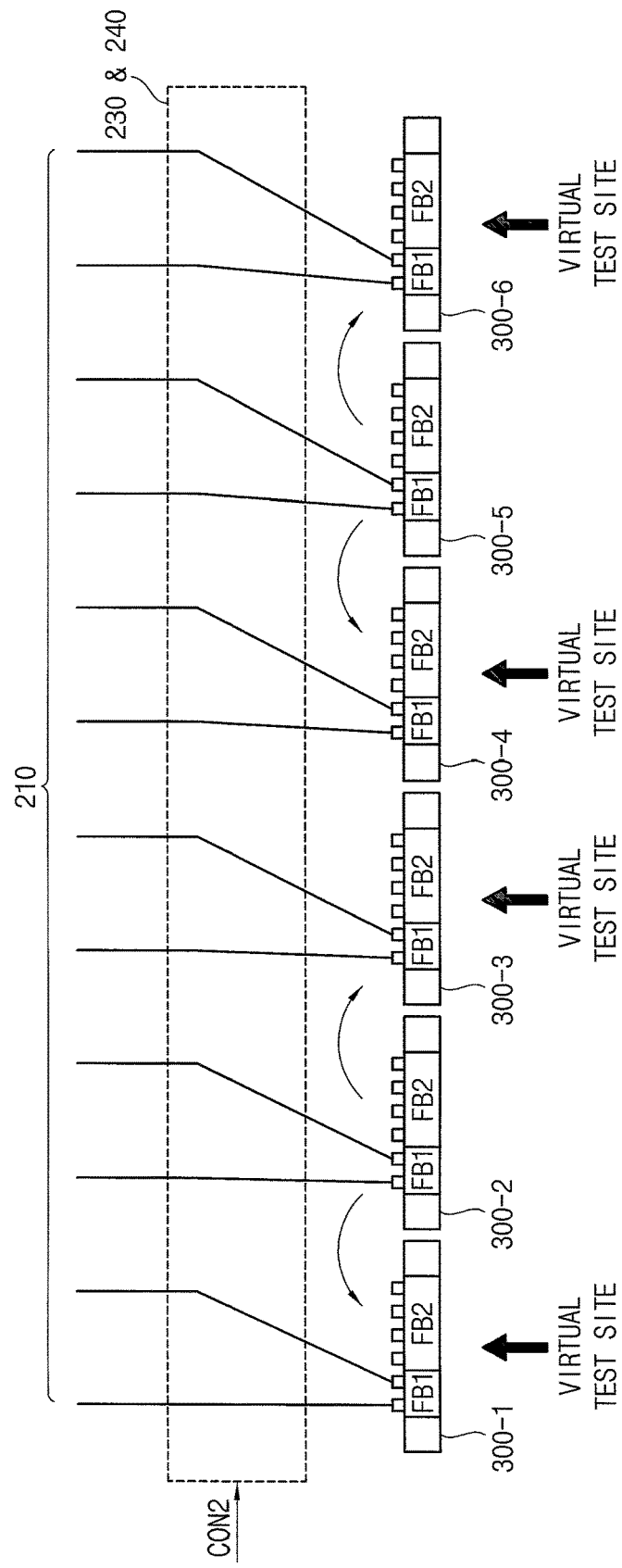
FIGS. 5 and 6 are diagrams for describing an operation of the test system of FIG. 1 performed in a manufacturing process of a semiconductor device.
Figure 6:
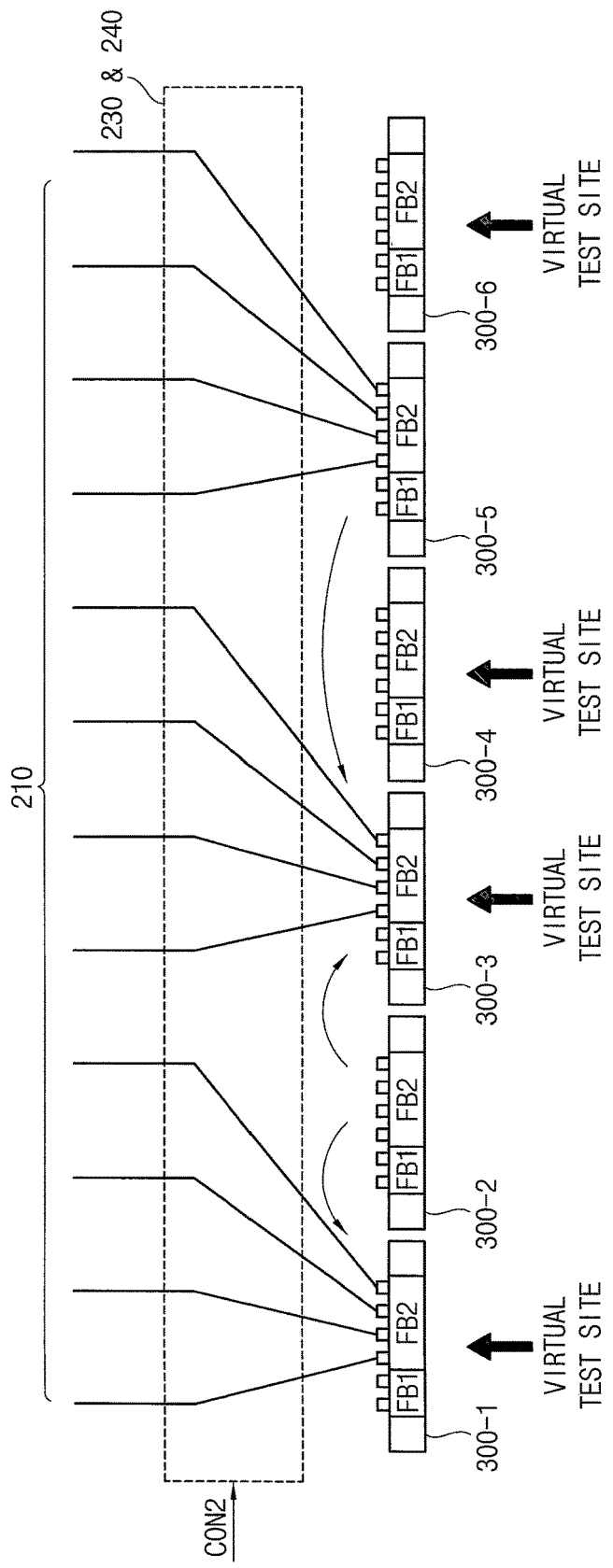

FIGS. 5 and 6 are diagrams for describing an operation of the test system of FIG. 1 performed in a manufacturing process of a semiconductor device.

As described above, in a manufacturing process of a semiconductor device, the semiconductor device is tested in the separation test mode such that functional blocks included in the semiconductor device are tested separately. Therefore, FIGS. 5 and 6 represent an operation of the test system 10 in the separation test mode.

In FIGS. 5 and 6, the test system 10 is illustrated to include twelve test channels 210 and six test sites 300-1~300-6 as an example. In addition, two of the first test pads 511-1 and 511-2 are coupled to the first functional block FB1 included in the semiconductor device 500, and four of the second test pads 512-1, 512-2, 512-3, and 512-4 are coupled to the second functional block FB2 included in the semiconductor device 500 in FIGS. 5 and 6. However, example embodiments are not limited thereto. According to example embodiments, the test system 10 may include any number of test channels 210 and any number of test sites 300. In addition, any number of the first test pads 511-1~511-x may be coupled to the first functional block FB1, and any number of the second test pads 512-1~512-y may be coupled to the second functional block FB2.

In the separation test mode, the test system 10 may determine a part of the plurality of functional blocks FB1 and FB2 included in the semiconductor device 500 as at least one test functional block, and simultaneously test only the at least one test functional block included in at least one of the plurality of semiconductor devices 500 installed on the plurality of test sites 300. For example, in the separation test mode, the test system 10 may consecutively select each of the plurality of functional blocks FB1 and FB2 included in the semiconductor device 500 as the test functional block, and consecutively perform a test operation on the selected test functional block to test the plurality of functional blocks FB1 and FB2 included in the semiconductor device 500.

In some example embodiments, when the semiconductor device 500 includes more than three functional blocks, more than two functional blocks may be selected as the at least one test functional block.

In some example embodiments, in the separation test mode, the test header 200 may connect the plurality of test channels 210 to test pads 510, which are coupled to the at least one test functional block included in at least one of the plurality of semiconductor devices 500 installed on the plurality of test sites 300, through the path control circuit 230 and the probe card 240 based on the second control signal CON2 received from the test control device 100.

For example, as illustrated in FIG. 5, when the first functional block FB1 is selected as the test functional block among the plurality of functional blocks FB1 and FB2 included in the semiconductor device 500, two test channels 210 among the plurality of test channels 210 may be connected to the plurality of first test pads 511-1 and 511-2, which are included in the six semiconductor devices 500 installed on the first through sixth test sites 300-1~300-6, respectively. In addition, as illustrated in FIG. 6, when the second functional block FB2 is selected as the test functional block among the plurality of functional blocks FB1 and FB2 included in the semiconductor device 500, four test channels 210 among the plurality of test channels 210 may be connected to the plurality of second test pads 512-1, 512-2, 512-3, and 512-4, which are included in the three semiconductor devices 500 installed on the first, third, and fifth test sites 300-1, 300-3, and 300-5, respectively.

After that, the test control device 100 may simultaneously test only the at least one test functional block among the plurality of functional blocks FB1 and FB2 included in the at least one of the plurality of semiconductor devices 500 to which the plurality of test channels 210 are coupled.

For example, as illustrated in FIG. 5, the test system 10 may simultaneously test the first functional block FB1 included in the six semiconductor devices 500 installed on the first through sixth test sites 300-1~300-6. In addition, as illustrated in FIG. 6, the test system 10 may simultaneously test the second functional block FB2 included in the three semiconductor devices 500 installed on the first, third, and fifth test sites 300-1, 300-3, and 300-5.

As described above with reference to FIGS. 5 and 6, in the separation test mode, the number of semiconductor devices 500, which are tested simultaneously, among the plurality of semiconductor devices 500 installed on the plurality of test sites 300 may correspond to an integer part of a value generated by dividing the number of the plurality of test channels 210 by the number of the test pads 510 coupled to the at least one test functional block. Therefore, in the separation test mode, the test system 10 may simultaneously test a maximum number of semiconductor devices 500 that the test system 10 is able to test at one time using the plurality of test channels 210.

For example, in the case of FIG. 5, the test system 10 may simultaneously test the first functional block FB1 included in the semiconductor devices 500 of a maximum Para number, that is, six semiconductor devices 500 in the separation test mode. Similarly, in the case of FIG. 6, the test system 10 may simultaneously test the second functional block FB2 included in the semiconductor devices 500 of a maximum Para number, that is, three semiconductor devices 500 in the separation test mode.

In some example embodiments, as illustrated in FIG. 6, in order to connect the probe needles 242 included in the test header 200 to the plurality of test pads 510 included in the semiconductor device 500 easily, the test sites 300-2, 300-4, and 300-6 on which semiconductor devices 500 including no test pad 510 connected to the plurality of test channels 210 are installed may be evenly distributed among the test sites 300-1, 300-3, and 300-5 on which semiconductor devices 500 including the plurality of test pads 510 connected to the plurality of test channels 210 are installed.

As described above with reference to FIG. 4, the test system 10 may further include the virtual test sites 300-1, 300-3, 300-4, and 300-6 besides the test sites 300-2 and 300-5 of the maximum Para number of the one-time test mode on which the semiconductor devices 500 actually being tested are installed.

Therefore, as illustrated in FIGS. 4 to 6, the test system 10 may distribute the plurality of test channels 210, which are allocated to the semiconductor devices 500 installed on the second test site 300-2 and the fifth test site 300-5 in the one-time test mode, to the semiconductor devices 500 installed on adjacent virtual test sites 300-1, 300-3, 300-4, and 300-6.

Therefore, in the separation test mode, the test system 10 may be able to simultaneously test the semiconductor devices 500 of a maximum Para number of the separation test mode for each of the test functional blocks among the plurality of functional blocks FB1 and FB2.

As described above with reference to FIGS. 4 to 6, in the one-time test mode performed in a development process of the semiconductor device 500, the test system 10 may intensively allocate the plurality of test channels 210 to a part of the plurality of semiconductor devices 500 installed on the plurality of test sites 300 to simultaneously test all of the functional blocks included in the part of the plurality of semiconductor devices 500. Therefore, the test system 10 may simultaneously test the semiconductor devices 500 of a maximum Para number in the one-time test mode.

In the separation test mode performed in a manufacturing process of the semiconductor device 500, the test system 10 may distribute at least one of the plurality of test channels 210, which are intensively allocated to the part of the plurality of semiconductor devices 500 in the one-time test mode, to the test pads 510 included in the semiconductor devices 500 installed on adjacent virtual test sites, such that the test system 10 may test only the selected test functional block among the plurality of the functional blocks included in the semiconductor device 500. Therefore, the test system 10 may simultaneously test the semiconductor devices 500 of a maximum Para number in the separation test mode.

FIG. 7 is a diagram illustrating the number of semiconductor devices simultaneously tested by the test system of FIG. 1 according to an operation mode.

In FIG. 7, the number of the semiconductor devices 500 simultaneously tested by the test system 10 (that is, the Para number) according to an operation mode is illustrated when the test system 10 includes twelve test channels 210 and six test sites 300-1~300-6, two of the first test pads 511-1 and 511-2 are coupled to the first functional block FB1 included in the semiconductor device 500, and four of the second test pads 512-1, 512-2, 512-3, and 512-4 are coupled to the second functional block FB2 included in the semiconductor device 500.

Referring to FIG. 7, as described above with reference to FIGS. 4 to 6, since the test system 10 simultaneously tests all of the plurality of functional blocks FB1 and FB2 in the one-time test mode, the test system 10 may simultaneously test two semiconductor devices 500, which corresponds to a maximum number of the semiconductor devices 500 that the test system 10 is able to test simultaneously using the twelve test channels 210.

On the other hand, when the test system 10 tests the first functional block FB1 among the plurality of functional blocks FB1 and FB2 in the separation test mode, the test system 10 may simultaneously test six semiconductor devices 500, which corresponds to a maximum number of the semiconductor devices 500 that the test system 10 is able to test simultaneously using the twelve test channels 210. When the test system 10 tests the second functional block FB2 among the plurality of functional blocks FB1 and FB2 in the separation test mode, the test system 10 may simultaneously test three semiconductor devices 500, which corresponds to a maximum number of the semiconductor devices 500 that the test system 10 is able to test simultaneously using the twelve test channels 210.

As described above with reference to FIGS. 1 to 7, the test system 10 according to example embodiments may further include the virtual test sites 300-1, 300-3, 300-4, and 300-6 besides the test sites 300-2 and 300-5 of the maximum Para number of the one-time test mode. Therefore, during a development process of a semiconductor device 500, the test system 10 may operate in the one-time test mode, such that the test system 10 may simultaneously test a maximum number of the semiconductor devices 500 that the test system 10 is able to test using the plurality of test channels 210 at one time. On the other hand, during a manufacturing process of a semiconductor device 500, the test system 10 may operate in the separation test mode, such that the test system 10 may simultaneously test a maximum number of the semiconductor devices 500 that the test system 10 is able to test using the plurality of test channels 210 at one time.

Therefore, the test system 10 may simultaneously test the semiconductor devices 500 of a maximum Para number in each of the one-time test mode and the separation test mode. As such, time required for the test system 10 to test the plurality of semiconductor devices 500 may be effectively decreased.

In addition, since the semiconductor devices 500 of a maximum Para number are simultaneously tested by the same test system 10 both in the one-time test mode and in the separation test mode, a manufacturing cost of the test system 10 may be decreased.

In some example embodiments, the test system 10 may perform the test operation described above with reference to FIGS. 1 to 7 on the plurality of semiconductor devices 500 in the state of a wafer.

In other example embodiments, the test system 10 may perform the test operation described above with reference to FIGS. 1 to 7 on the plurality of semiconductor devices 500 in the state of a package. In this case, the test system 10 may perform the test operation while the semiconductor devices 500 to be tested are installed on the test sites 300 and the semiconductor devices 500 not to be tested are removed from the test sites 300 according to an operation mode.

Figure 8:
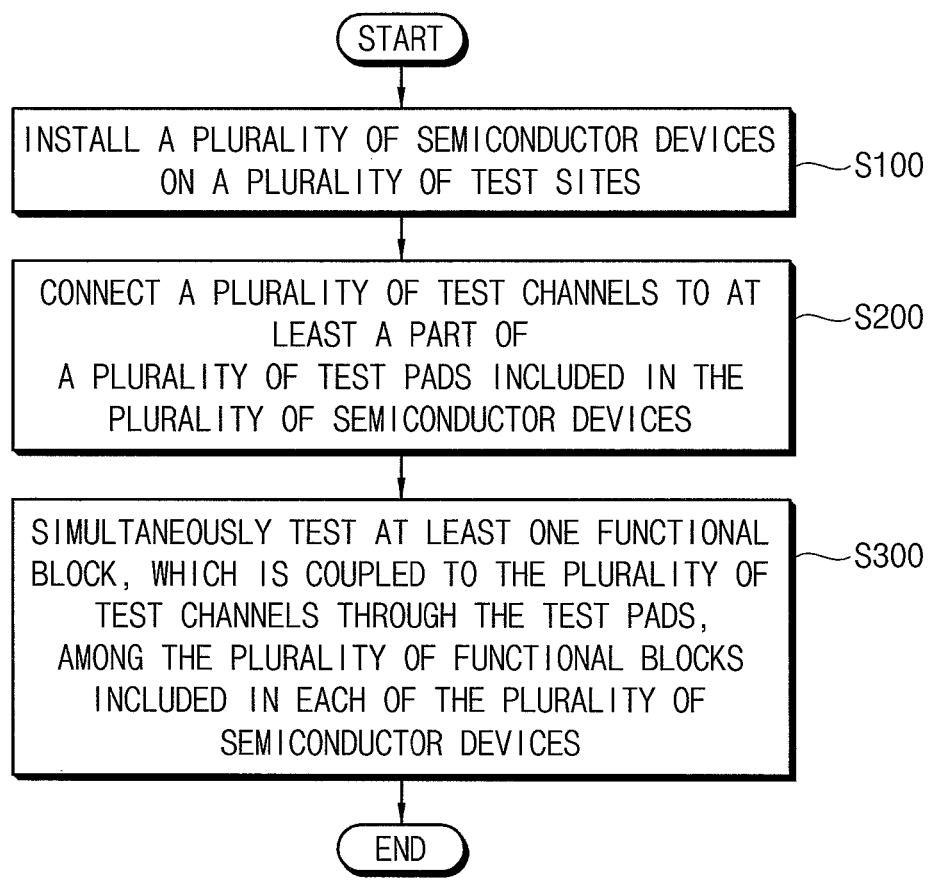
FIG. 8 is a flow chart illustrating a method of testing a semiconductor device according to example embodiments.

FIG. 8 is a flow chart illustrating a method of testing a semiconductor device according to example embodiments.

The method of testing a semiconductor device of FIG. 8 may be performed by the test system 10 of FIG. 1.

Hereinafter, a method of testing the semiconductor device 500 will be described with reference to FIGS. 1 to 8.

Referring to FIG. 8, the plurality of semiconductor devices 500 may be installed on the plurality of test sites 300 (step S100). Under a control of the test control device 100, the test header 200 may connect the plurality of test channels 210 to at least a part of the plurality of test pads 510 included in the plurality of semiconductor devices 500 installed on the plurality of test sites 300 (step S200).

After that, a test operation may be simultaneously performed on at least one functional block, which is coupled to the plurality of test channels 210 through the test pads 510, among the plurality of functional blocks FB1 and FB2 included in each of the plurality of semiconductor devices 500 (step S300).

In some example embodiments, the number of the plurality of test sites 300 may be greater than a value generated by dividing the number of the plurality of test channels 210 by the number of the plurality of test pads 510 included in each of the plurality of semiconductor devices 500.

Figure 9:
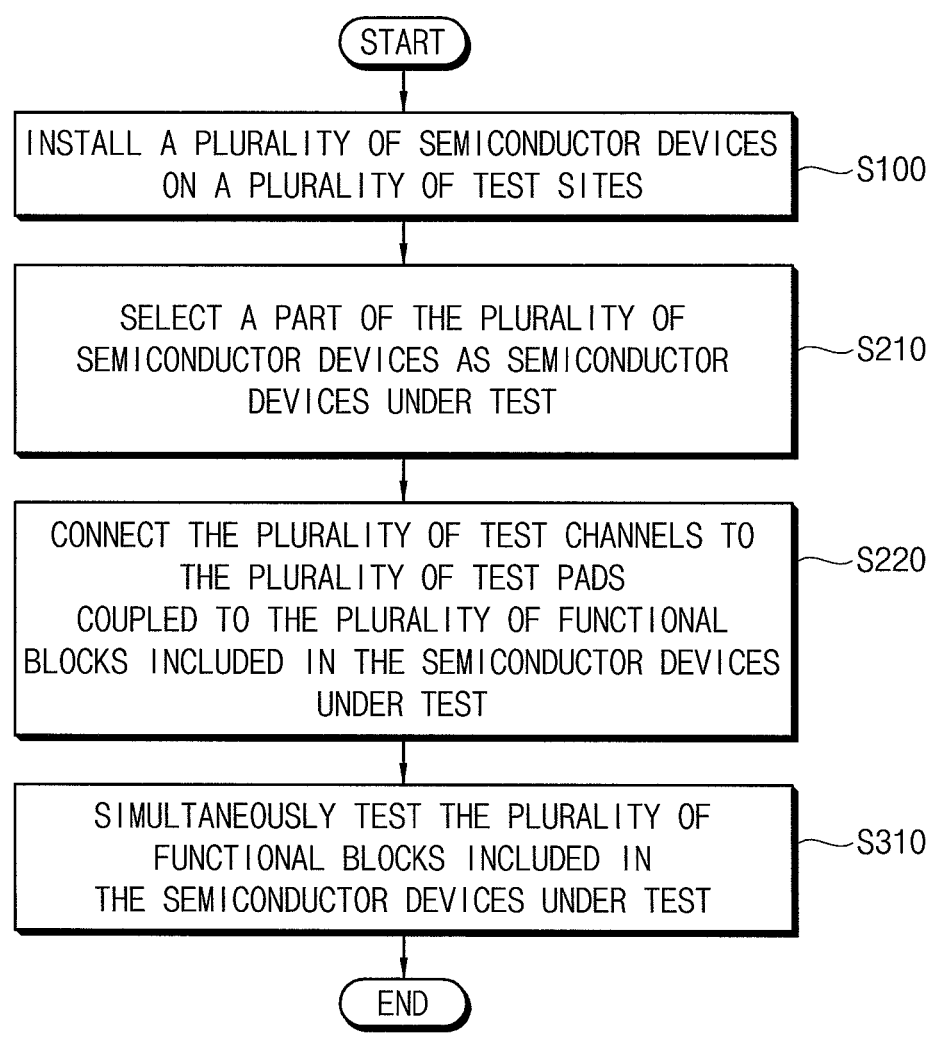
FIG. 9 is a flow chart illustrating the method of testing a semiconductor device of FIG. 8 in a one-time test mode.

FIG. 9 is a flow chart illustrating the method of testing a semiconductor device of FIG. 8 in a one-time test mode.

Referring to FIG. 9, after the plurality of semiconductor devices 500 are installed on the plurality of test sites 300 (step S100), the test header 200 may, under a control of the test control device 100, select a part of the plurality of semiconductor devices 500 as semiconductor devices under test (step S210). The number of the part of the plurality of semiconductor devices 500 selected as the semiconductor devices under test may correspond to an integer part of a value generated by dividing the number of the plurality of test channels 210 by the number of the plurality of test pads 510 coupled to the plurality of functional blocks FB1 and FB2 included in each of the plurality of semiconductor devices 500.

After that, the test header 200 may, under a control of the test control device 100, connect the plurality of test channels 210 to the plurality of test pads 510 coupled to the plurality of functional blocks 1-B1 and FB2 included in the semiconductor devices under test (step S220), and simultaneously test the plurality of functional blocks FB1 and FB2 included in the semiconductor devices under test (step S310).

Figure 10:
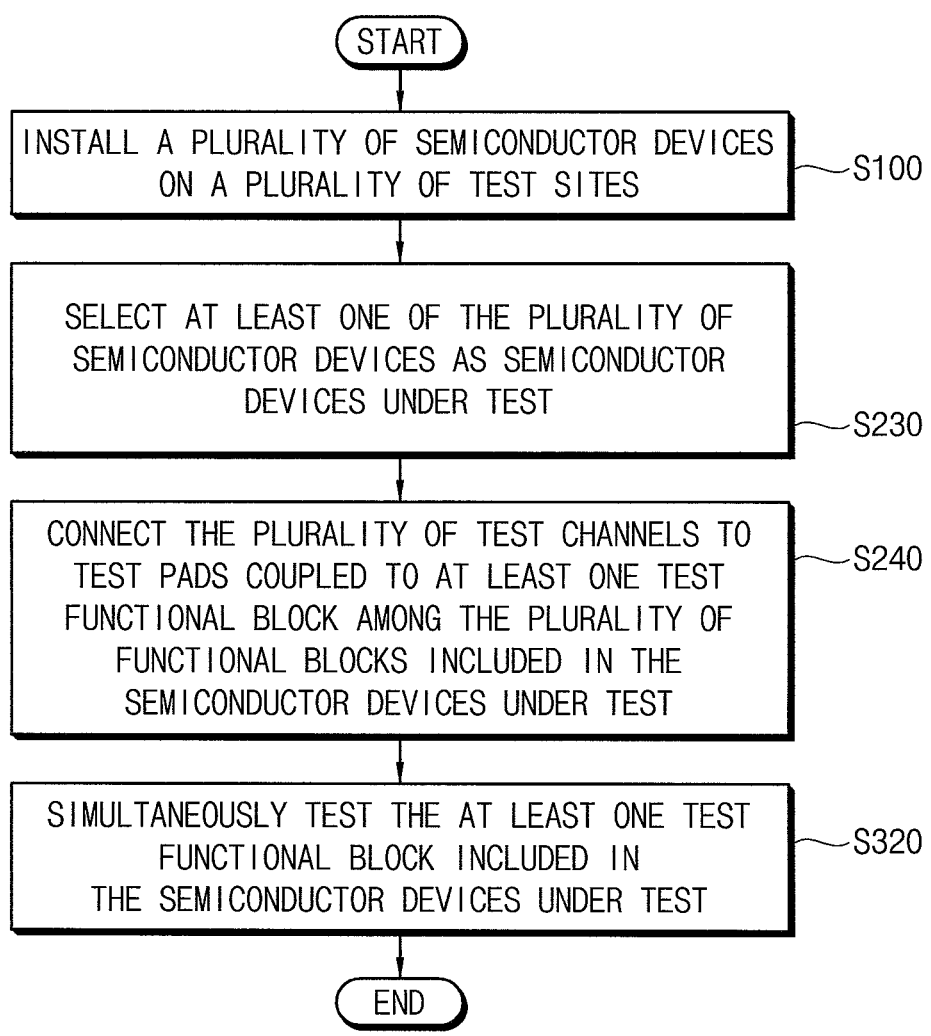
FIG. 10 is a flow chart illustrating the method of testing a semiconductor device of FIG. 8 in a separation test mode.

FIG. 10 is a flow chart illustrating the method of testing a semiconductor device of FIG. 8 in a separation test mode.

Referring to FIG. 10, after the plurality of semiconductor devices 500 are installed on the plurality of test sites 300 (step S100), the test header 200 may, under a control of the test control device 100, select at least one of the plurality of semiconductor devices 500 as semiconductor devices under test (step S230). The number of the at least one of the plurality of semiconductor devices 500 selected as the semiconductor devices under test may correspond to an integer part of a value generated by dividing the number of the plurality of test channels 210 by the number of test pads 510 coupled to at least one test functional block among the plurality of functional blocks FB1 and FB2 (step S230).

After that, the test header 200 may, under a control of the test control device 100, connect the plurality of test channels 210 to the test pads 510 coupled to the at least one test functional block included in the semiconductor devices under test (step S240), and simultaneously test the at least one test functional block included in the semiconductor devices under test (step S320).

A structure and an operation of the test system 10 of FIG. 1 are described above with reference to FIGS. 1 to 7. Therefore, detailed description of the steps of FIGS. 8 to 10 will be omitted.

As described above with reference to FIGS. 1 to 10, in the method of testing a semiconductor device according to example embodiments, the semiconductor devices 500 of a maximum Para number may be simultaneously tested both in the one-time test mode and in the separation test mode. Therefore, the time required to test the plurality of semiconductor devices 500 may be effectively decreased.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The foregoing is illustrative of the present disclosure and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A test device for testing a plurality of semiconductor devices, each of which includes a plurality of functional blocks and a plurality of test pads coupled to the functional blocks, the test device comprising:
 a test header including a plurality of test channels;
 a plurality of test sites on which the semiconductor devices are installed; and
 a test control device configured to allocate the test channels to at least some of the test pads of the semiconductor devices to test more than two of the semiconductor devices simultaneously, wherein
 a quantity of test sites on which the semiconductor devices are installed is greater than a value generated by dividing a quantity of test channels in the test header by a quantity of test pads of each of the semiconductor devices.

2. The test device of claim 1, wherein the test control device:
 allocates, dynamically in a first test mode, a first test channel among the test channels to one of the test pads of a semiconductor device that is installed on a first test site among the test sites, and
 allocates, dynamically in a second test mode, the first test channel to one of the test pads of a semiconductor device that is installed on a second test site, which is different from the first test site, among the test sites.

3. The test device of claim 2, wherein:
 the first test mode corresponds to a one-time test mode in which all of the functional blocks of some of the semiconductor devices are tested simultaneously, and
 the second test mode corresponds to a separation test mode in which only some of the functional blocks of at least one of the semiconductor devices are tested simultaneously.

4. The test device of claim 2, wherein the second test site is adjacent to the first test site.

5. The test device of claim 1, wherein a quantity of semiconductor devices that are tested simultaneously corresponds to an integer part of a value generated by dividing the quantity of test channels in the test header by a quantity of test pads coupled to at least one of the functional blocks which are tested simultaneously.

6. The test device of claim 1, wherein in a one-time test mode in which all of the functional blocks are tested simultaneously, the test control device connects the test channels to only some of the semiconductor devices installed on the test sites.

7. The test device of claim 6, wherein in the one-time test mode, the semiconductor devices that are simultaneously tested are evenly distributed among the test sites.

8. The test device of claim 6, wherein in the one-time test mode, a quantity of semiconductor devices that are tested simultaneously corresponds to an integer part of a value generated by dividing the quantity of test channels in the test header by a quantity of test pads coupled to the plurality of functional blocks.

9. The test device of claim 6, wherein in the one-time test mode, the test control device connects the test channels to all of the test pads of the some semiconductor devices and simultaneously tests all of the functional blocks of the some semiconductor devices.

10. The test device of claim 1, wherein in a separation test mode in which at least one test functional block among the functional blocks is tested, the test control device connects the test channels to test pads coupled to the at least one test functional block of at least one of the semiconductor devices.

11. The test device of claim 10, wherein in the separation test mode, a quantity of semiconductor devices that are tested simultaneously corresponds to an integer part of a value generated by dividing the quantity of test channels in the test header by a quantity of test pads coupled to the at least one test functional block.

12. The test device of claim 1, wherein the test header further includes:
 a controller configured to provide a test sequence, which is received from the test control device, to the test channels, and to provide a test result signal, which is received from the test channels, to the test control device;
 a path control circuit configured to control connections between the test channels and a plurality of output electrodes based on a control signal received from the test control device; and
 a probe card including connectors coupled to the output electrodes and probe needles contacting the plurality of test pads of the semiconductor devices.

13. The test device of claim 1, wherein the test channels include:
 a plurality of drive channels configured to test drive pads among the test pads of the semiconductor devices; and
 a plurality of input-output channels configured to test input-output pads among the test pads of the semiconductor devices.

14. A test system comprising:
 a plurality of semiconductor devices, each of the semiconductor devices including a plurality of functional blocks and a plurality of test pads coupled to the functional blocks; and
 a test device including a plurality of test channels and a plurality of test sites on which the semiconductor devices are installed, the test device allocating the test channels to at least some of the test pads of the semiconductor devices to test more than two of the semiconductor devices simultaneously, wherein
 a quantity of test sites on which the semiconductor devices are installed is greater than a value generated by dividing a quantity of test channel in the test device by a quantity of test pads of each of the semiconductor devices.

15. The test system of claim 14, wherein the test device:
 allocates, dynamically in a first test mode, a first test channel among the test channels to one of the test pads of a semiconductor device that is installed on a first test site among the test sites, and
 allocates, dynamically in a second test mode, the first test channel to one of the test pads of a semiconductor device that is installed on a second test site, which is different from the first test site, among the test sites.

16. A test device that tests a plurality of semiconductor devices, each of which includes a plurality of functional blocks, the test device comprising:

a plurality of test channels; and a test control device that:

for a first mode of operation, connects the test channels to all of the functional blocks of one or more of the semiconductor devices so as to simultaneously test all of the functional blocks of the one or more semiconductor devices, and for a second mode of operation, connects the test channels to fewer than all of the functional blocks of two or more of the semiconductor devices so as to simultaneously test the fewer than all functional blocks of the two or more semiconductor devices, wherein a maximum quantity of semiconductor devices connected to the test channels for simultaneously testing through each of the first and second modes of operation is an integer value expressed by a division of a quantity of test channels of the test device by a quantity of test channels connected to one of the one or more semiconductor devices.

17. The test device of claim 16, wherein some of the test channels are connected to a first of the semiconductor devices for the first mode of operation and connected to a second of the semiconductor devices, differing from the first semiconductor device, for the second mode of operation.

18. The test device of claim 16, wherein:

for the second mode of operation, the test control device connects the test channels to:

a first of the functional blocks of a first number of the semiconductor devices so as to simultaneously test the first functional blocks of the first number of semiconductor devices, and a second of the functional blocks of a second number of the semiconductor devices so as to simultaneously test the second functional blocks of the second number of semiconductor devices, and the first number and the second numbers differ.

19. The test device of claim 18, wherein:

a maximum value of the first number is an integer value expressed by a division of the quantity of test channels by a quantity of test channels connected to the first functional block of one of the first number of semiconductor devices, and a maximum value of the second number is an integer value expressed by a division of the quantity of test channels by a quantity of test channels connected to the second functional block of one of the second number of semiconductor devices.

* * * * *